(12) United States Patent
Lu

(10) Patent No.: US 6,856,230 B2
(45) Date of Patent: Feb. 15, 2005

(54) HARMONIC FILTERING CIRCUIT WITH SPECIAL TRANSFORMER

(76) Inventor: Weimin Lu, 39577 Squire Rd., Novi, MI (US) 48375

(*) Notice: Subject to any disclaimer, the term of this patent is extended or adjusted under 35 U.S.C. 154(b) by 5 days.

(21) Appl. No.: 10/446,002

(22) Filed: May 27, 2003

(65) Prior Publication Data

US 2004/0239470 A1 Dec. 2, 2004

(51) Int. Cl.$^7$ .............................................. H01F 27/24
(52) U.S. Cl. .................. 336/212; 336/217; 336/165; 336/170; 336/178; 336/215; 323/309; 323/306; 323/308; 323/248
(58) Field of Search ................................ 336/217, 165, 336/170, 178, 215; 323/309, 306, 308, 248

(56) References Cited

U.S. PATENT DOCUMENTS

| | | | |
|---|---|---|---|
| 2,694,177 A | 11/1954 | Sola ............................. | 323/60 |
| 3,521,147 A | 7/1970 | Ostreicher ................... | 321/16 |
| 3,521,152 A | 7/1970 | Emerson ...................... | 323/60 |
| 3,546,571 A | 12/1970 | Fletcher et al. .............. | 323/60 |
| 3,584,290 A | 6/1971 | Spreadbury ................... | 323/6 |
| 3,652,293 A | 3/1972 | Knudson ....................... | 323/6 |
| 3,662,254 A | 5/1972 | Gorbuntsov .................. | 323/45 |
| 3,686,561 A | 8/1972 | Spreadbury ................... | 323/6 |
| 3,803,479 A | 4/1974 | Rathor ......................... | 323/44 |
| 4,007,416 A | 2/1977 | Szatmari ...................... | 323/60 |
| 4,019,122 A | 4/1977 | Ryan ........................... | 323/60 |
| 4,075,547 A | 2/1978 | Wroblewski .................. | 323/60 |
| 4,088,942 A | 5/1978 | Miko ............................ | 323/60 |
| 4,138,636 A | 2/1979 | Liberman ...................... | 323/45 |
| 4,339,706 A | 7/1982 | Kusko ........................... | 323/248 |
| 4,602,236 A | 7/1986 | Shelby et al. ................. | 336/216 |
| 4,631,471 A | 12/1986 | Fouad .......................... | 323/306 |
| 4,975,649 A | 12/1990 | Bobry .......................... | 324/547 |
| 5,073,766 A | 12/1991 | Hays ............................. | 336/217 |
| 5,272,831 A | 12/1993 | Willis ........................... | 43/112 |
| 5,912,553 A * | 6/1999 | Mengelkoch ................ | 323/309 |

FOREIGN PATENT DOCUMENTS

JP 355138819 A 10/1980 ................. 336/234

* cited by examiner

*Primary Examiner*—Lincoln Donovan
*Assistant Examiner*—Jennifer A. Poker
(74) *Attorney, Agent, or Firm*—Donald P. Gillette

(57) ABSTRACT

A filter uses a special autotransformer that has a ferromagnetic core with a plurality of legs and flux return bars. A first coil is located on one leg, and a second coil is located on the same leg, but spaced from the first coil. The first coil and at least part of the second coil are connected in series to receive distorted alternating current and at least that part of the second coil is connected to an output terminal. Between the coils and extending at least part of the way from the first leg to an adjacent leg is a magnetic shunt assembly to divert part of the flux generated in the first coil by the alternating current so that that part does not link with the second coil. An air gap is located to link with the second coil to create an inductor in that coil by flux in the second coil, and a capacitor is connected across the second coil to tune it to the fundamental frequency of the alternating current and substantially reduce harmonics in that current.

21 Claims, 9 Drawing Sheets

HARMONIC FILTERING CIRCUIT WITH SPECIAL TRANSFORMER

BACKGROUND OF THE INVENTION

1. Field of the Invention

This invention relates to filtering circuits to reduce harmonics in the alternating current from a power source, such as a public utility. The alternating current is expected to have a sinusoidal waveform at a certain frequency, which is the waveform required for many types of electrical apparatus. When the waveform is distorted at some location along the power line, the distortion takes the form of harmonics of the fundamental frequency, and those harmonics cannot be used in the way that the fundamental alternating current can; they are power losses to the utility and can be detrimental to equipment being used by other customers connected to the alternating current source by the same power line. As a result, utilities increase their charge to customers whose equipment produces such harmonics, and in order to reduce such increased charges, the customers who incur those charges would like to be able to filter out the harmonics.

2. The Prior Art

My prior applications, Ser. No. 09/878,528 filed Jun. 11, 2001 and Ser. No. 10/197,999 filed Jul. 17, 2002, disclose transformer circuits for achieving two important results simultaneously, even though those circuits use transformers that have only two coils. First, the circuits control the amplitude of their output voltage, and second, they eliminate harmonics in that voltage, which means that the harmonics are also eliminated from the alternating current associated with the output voltage. Prior to the inventions disclosed in my applications, transformer-based systems to obtain an output voltage that had a constant magnitude and a sinusoidal waveform, i.e., without a high harmonic content, required at least three coils.

While the transformer-based circuits disclosed in my prior applications remove harmonics from the waveform of alternating current transmitted through them, those circuits are too expensive if it is not necessary to hold the magnitude of the output voltage close to a certain value, but instead to allow it to vary with the magnitude of the input voltage, which may vary within a range of about ±15%.

Rather simple means, such as inductors and standard $\pi$ and L low-pass filters are sometimes connected in the power line to remove harmonics, particularly higher multiples of the fundamental frequency, when it is not necessary to control the magnitude of the output voltage, but inductors, and even simple filters do not remove lower harmonics, such as the third harmonic, very well. It is important that all harmonics be removed because the Institute for Electrical and Electronic Engineers (IEEE-519-1992) for Harmonic Control in Electrical Power Systems requires that the total harmonic distortion (THD) be less than 5% THD, and the standard low-pass filters cannot do that.

It is also possible to use individual harmonic traps tuned, for example, to the $3^{rd}$, $5^{th}$, and $7^{th}$ harmonics to remove them, but providing a separate trap for each harmonic is a very expensive way of achieving a harmonic-free output, and the harmonic energy removed by such traps is completely wasted and turned into heat. The separate traps, however, can meet the 5% THD requirement.

OBJECTS AND SUMMARY OF THE INVENTION

It is an object of the present invention to remove substantially all of the harmonics of the fundamental frequency from the distorted waveform of an alternating current power line by means of a relatively simple and inexpensive filter incorporating a special autotransformer that generates an inductive reactance within itself and a tuning capacitor that tunes that inductive reactance to the fundamental frequency so that only alternating current at the fundamental frequency can pass through to locations farther along the power line.

Another object is to provide a circuit using a special autotransformer and a tuning capacitor to remove, or at least substantially reduce, all harmonics from a single-phase alternating current power line.

Still another object is to provide a circuit using a special three-phase autotransformer and a tuning capacitor for each phase to remove, or substantially reduce, all harmonics from a three-phase alternating current power line.

Another object is to simplify the manufacture of harmonic-removing filters for alternating current power lines and to reduce the size and cost of such filters in comparison with other filtering means capable of achieving more or less the same degree of filtering.

Yet another object is to form a built-in inductor in the secondary and to tune this inductor with a single capacitor to substantially reduce all harmonics of the fundamental frequency in a power line carrying a distorted alternating current.

It is also an object of this invention to reduce the rise of temperature in the components, including the transformer core, the capacitor, and the secondary winding of a filter capable of reducing substantially the amplitude of even the lowest harmonics of the fundamental frequency of an alternating current power line.

A further object is to provide a filter for substantially reducing harmonics in a three-phase power system using a simple transformer circuit that has: a single magnetic core structure with three legs, each of which serves as the winding leg for one phase and as a return leg for each of the other two phases; a similar set of Y-connected coils and windings on each leg connected to form a three-phase autotransformer; a region of increased reluctance in each leg to create an inductor in series with the respective windings; and a set of delta-connected capacitors connected to the windings to tune them to the fundamental frequency.

A still further object is to provide a filter to remove harmonics from a distorted alternating current that includes a fundamental frequency and harmonics, the filter comprising: an autotransformer comprising a core of ferromagnetic material comprising: a plurality of adjacent legs forming parts of a low-reluctance flux path, a first bar forming part of the low-reluctance flux path between the legs at one end thereof, and a second bar providing part of the low-reluctance flux path between the legs the other end thereof; a first coil at a first location on one of the legs and having first and second terminals; a second coil on the same leg as the first coil and at a second location spaced from the first location, the second coil having third and fourth terminals; an electrical connection between the second and third terminals, whereby the first and second coils form a series input circuit between the first and fourth terminals to receive the distorted alternating current; an output terminal; means to connect the electrical connection to the output terminal; a region of increased reluctance in a part of the flux path linking the second coil, whereby flux in that region creates a built-in inductor in the second coil; magnetic shunt means magnetically coupled to one of the legs at a third location thereon between the first and second coils and to another of the legs, whereby some of the flux generated by alternating current flowing in the first coil is by-passed through the shunt means without linking with the second coil; and capacitor means connected in series with the second coil to resonate with the built-in inductor at the fundamental frequency.

Additional objects may become apparent after studying the following specification and claims.

Before considering the description of the filter circuit in detail, it should be noted that it contains coils, each of which may include one or more windings. In the case of a coil that is made up of only one winding, it is unnecessary to refer to that winding each time reference is made to that coil; it is enough simply to refer to that coil. In the case of a coil that has more than one winding, the windings are closely physically associated with each other so that each of them is affected by pretty much the same magnetic flux, and each of them has a pair of terminals, usually at or near the opposite ends of the coils, by which that winding can be connected to other windings or other components of the circuit.

A filter circuit that is in accordance with the invention includes a special autotransformer having a ferromagnetic core with at least one winding leg and return means, which together forming a relatively low-reluctance magnetic loop. In the simplest form of the invention, the input circuit across which the distorted alternating current is applied includes a first coil that is located on one part of the winding leg and connected in series with a second coil located on a different part of the winding leg. The second coil is also the output circuit, and the junction between the first and second coils is one of the output terminals. The other terminal of the second coil is one of the input terminals as well as being the other output terminal, which places the second coil in both the input and output circuits of the transformer, as is standard practice in autotransformers.

Magnetic shunt means are magnetically coupled to the winding leg means at a location between the spaced-apart coils and extend at least part of the distance between the winding leg means and the return means to form a path of somewhat reduced reluctance (compared to air) to divert to the return means part of the flux generated in the winding leg by the distorted input current in the first coil.

The core also includes a region of increased reluctance, such as an air gap, in a part of its magnetic loop carrying the flux linked with the second coil to generate, in effect, an inductor, or an inductive reactance, in the second coil. A capacitor chosen to have a capacitance that resonates with that inductive reactance at the fundamental frequency of the alternating current is connected in parallel with the second coil so that all harmonics of that frequency will be filtered out and substantially pure alternating current will emerge across the output terminals.

In a more complex filter, such as one connected to a relatively low-voltage power line, the second coil may be divided into two windings connected in series with each other. The output terminals are connected across only the first of these windings, which is the one connected to the first coil. The second of the windings in the second coil is connected in series with the capacitor across the output terminals and, therefore, in parallel with the first winding of the second coil.

Although the first coil and the first winding are connected in series between the input terminals, the fact that the first winding includes induced inductance causes the voltage across it not to be in phase with the input voltage, which will be the vector sum of the voltages across the first coil and across the first winding of the second coil. Thus, the magnitude of the output voltage across the first winding will be somewhat lower than the magnitude of the voltage applied to the input terminals.

The magnitude of the output voltage can be brought back up to that of the input voltage by providing a third winding as part of the second coil and connecting this third winding in series between the first output terminal and the junction between the first coil and the first winding of the second coil. The third winding shares in the inductive effect that applies to the first and second windings of the second coil, and thus the voltage across the third winding is at least substantially in phase with the voltage across the first and second windings. This allows the magnitude of the voltage across the third winding to simply be added to the magnitude of the voltage across the first winding so that the substantially harmonic-free output voltage of the filter is brought back up to the nominal voltage of the power line, or even higher.

The same concept is applicable to reduction of harmonics in a three-phase line as well as a single-phase line. The three-phase autotransformer includes three core legs, each of which serves as a winding leg for current of one phase and a return leg for current for each of the other phases.

DESCRIPTION OF PREFERRED EMBODIMENTS OF THIS INVENTION

Figure 1:
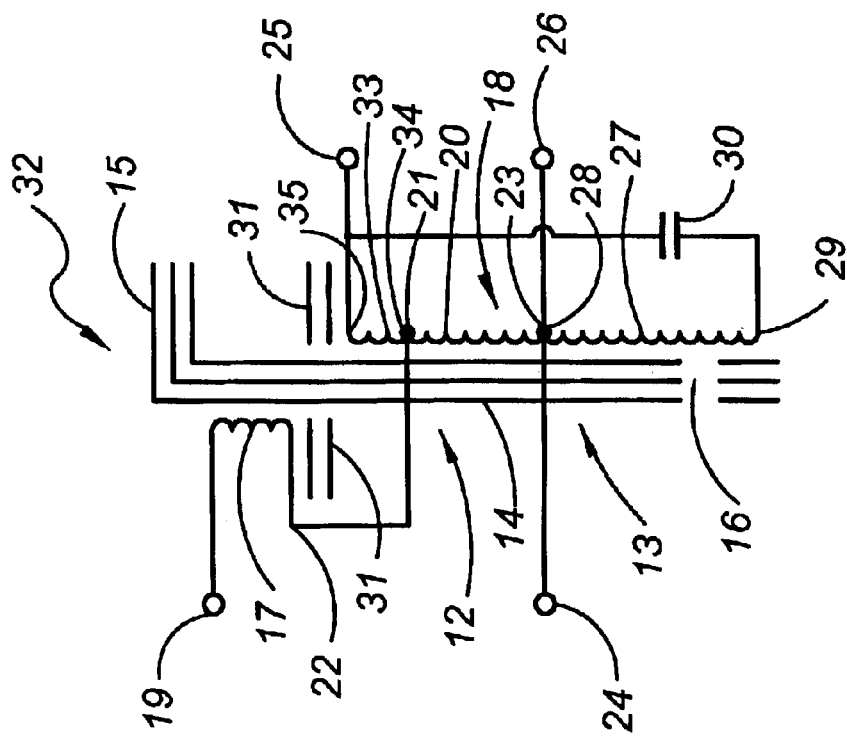
FIG. 1 is a schematic diagram of one form of the filter circuit of the invention.

FIG. 1 shows a filter circuit 11 comprising a special autotransformer 12 with a ferromagnetic core 13 that has a plurality of legs and bars that are parts of a low-reluctance flux path and include winding leg means 14 and flux return means 15. The core also has a region of substantially increased reluctance, such as an air gap 16. First and second coils 17 and 18 are in spaced-apart locations of the winding leg means 14, with one terminal 19 of the first coil serving as a first input terminal of the filter circuit. The second coil 18 includes a first winding 20 that has a first terminal 21 connected to a second terminal 22 of the first coil 17 to form a first series circuit from the terminal 19 to a second terminal 23 of the winding 20. The terminal 23 is connected to a second input terminal 24, so that the first coil 17 and the first winding 20 of the second coil 18 form the input circuit of the filter 11.

The connection between the terminals 21 and 22 is connected to a first output terminal 25 of the filter and the terminal 23 is connected to a second output terminal 26. It is convenient to refer to the terminal 23 as a common terminal since it is common to both the input terminal 24 and the output terminal 26. The first winding 20 of the second coil is also common to both the input and output circuits of the filter 11 in accordance with autotransformer circuitry.

The second coil 18 has a second winding 27 with a first terminal 28 connected to the common terminal 23 to form a second series circuit that extends between the terminal 21 and a second terminal 29 of the second winding. The air gap 16 creates, in effect, a built-in inductor in the windings 20 and 27 of this series circuit. A capacitor 30, which is connected in a series circuit with the inductor, is selected to have a capacitance such that this series circuit resonates at the fundamental frequency of the alternating current in the power line. As a result, the harmonics that constitute the distortion in the input voltage applied to the terminals 19 and 24 are eliminated from the output voltage at the terminals 25 and 26.

Magnetic shunt means 31 are located in the space between the first coil 17 and the second coil 18 on the winding leg means 14 and between the winding leg means and the flux return means to divert to the return means some of the magnetic flux produced in the winding leg means by current flowing in the coil 17.

The gauge of the wire in the coil 17 has to be capable of carrying the current required at the output terminals 25 and 26 plus the current, called excitation current, required for the winding 20. As an example, which is not to be considered a limitation of the invention, if the output current through the terminals 25 and 26 must be 8A., the current through the coil 17 must be greater than 8A., because part of the input current branches off as excitation current that flows through the winding 20. If the excitation current is 2A., the current through the coil 17 must be 10A, which is the sum of the excitation current and the output currents. Thus the gauge of the wire in the coil 17 has to be great enough to carry that current, and the gauge of the winding 20 would apparently have to be capable of carrying only the relatively small excitation current.

However, when the second winding 27 and the capacitor 30 are taken into account, the gauge of the wire making up the winding has to be greater than this apparently minimum amount. The reason is that, the current in the capacitor flows in the opposite direction from the excitation current, and typically has a greater magnitude, for example, 8A. If the excitation current is 2A. and is in the opposite direction from current through the loop consisting of the capacitor 30 and the windings 20 and 27, the difference current through the winding 20 is 6A., and the gauge of the wire making up that winding must be able to carry that current. Since both of the windings 20 and 27 of the coil 18 have an inductive reactance due to the air gap 16, the voltage across the capacitor is the sum of the voltages across the whole coil 18.

Figure 2:
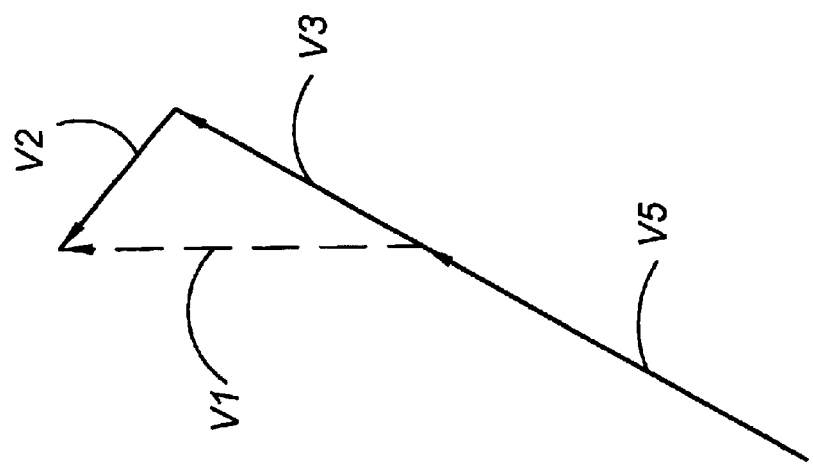
FIG. 2 is a vector diagram of voltages in the circuit in FIG. 1.

The voltages obtained during the operation of the filter circuit 11 in FIG. 1 are illustrated in the vector diagram in FIG. 2. The voltage V1 is the input voltage between the input terminals 19 and 24. It is, therefore, the vector sum of the voltage V2 across the first coil 17 and the voltage V3 across the first winding 20 of the second coil 18. Because of the inductive effect produced by the air gap 16, the voltage V3 is not in phase with the voltage V2. While the magnitude of the voltage V3, which is also the output voltage between the output terminals 25 and 26 is less than that of the input voltage V1 but not as much less as it would be without the inductive effect. Depending on the amount of distortion of the incoming power-line voltage V1, which may have a nominal value of 120v., the voltage V2 may be 40v. and the voltage V3 may be 90v. It is to be understood that the invention is not limited to any particular voltage values, which depend on the fact that the power-line voltage may vary ±15% and also depend on the amount and source of distortion.

Figure 3:
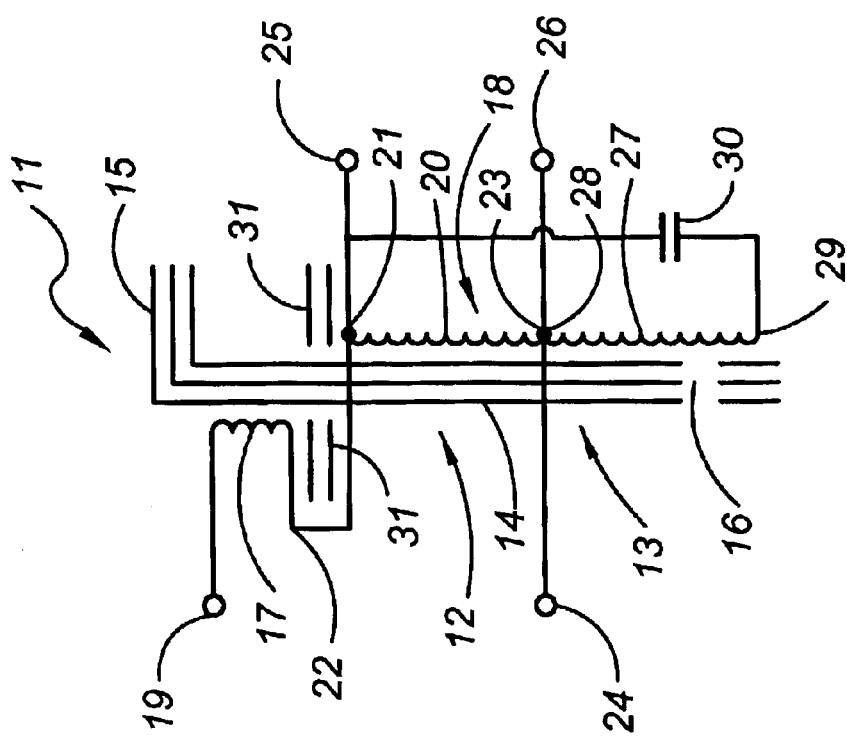
FIG. 3 is a schematic diagram of a modified form of the filter circuit of the invention to obtain an output voltage of a magnitude substantially equal to the magnitude of the input voltage.

FIG. 3 is a schematic diagram of a modified filter circuit 32 that includes means to increase the output voltage to the same magnitude as the input voltage. In order to do so, a source of additional, filtered voltage must be found. That is the purpose of a third winding 33 on the second coil 18, which may be referred to as a compensating winding since it compensates for the reduction of voltage that would otherwise take place. One terminal 34 of this additional winding is connected to the terminal 21 of the winding 20 and the other terminal 35 connects the winding 20 to the output terminal 25.

The current through the winding 33 also must be taken into account in determining the wire gauges. The direction of current through the winding 33 is in the same direction as the current that flows through the coil 17 to the output terminal 25 and is, therefore, in the same direction as the capacitor current. This requires that the gauge of the wire making up the winding 33 must be great enough to carry the sum of the capacitor current, which was suggested to be 8A. in the discussion in connection with FIG. 1. Since the output current flows in the same direction and has been assumed to be 8A., also, the total current through the winding 33 would be 16A., and the gauge of the wire making up the winding 33 has to be great enough to carry that current. At the end of the winding 33 connected to the output terminal 25, the 16A. current splits into an 8A. output current and an 8A. capacitor current.

Figure 4:
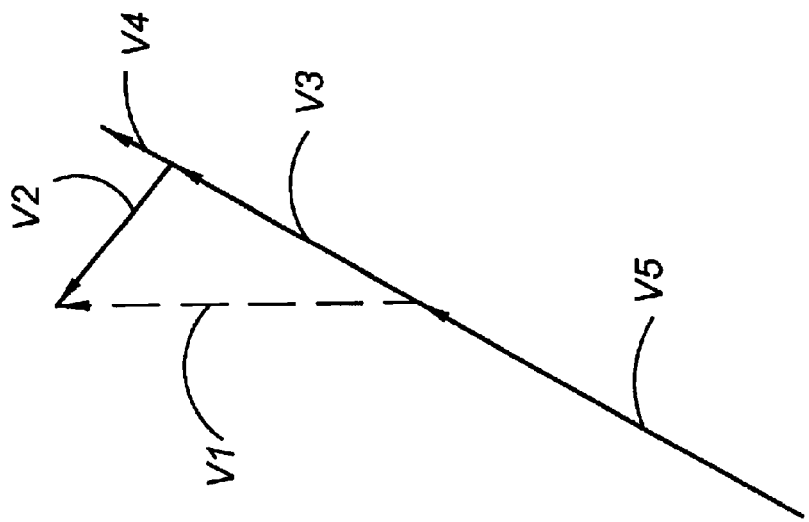
FIG. 4 is a vector diagram of voltages in the circuit in FIG. 3.

FIG. 4 is a vector diagram of the voltages in the circuit in FIG. 3. The voltages V1, V2, and V3 are the same as in FIG. 2. The voltage V4 is the voltage across the third winding 33 and the number of turns in that winding have been selected, for example by taps, to make the magnitude of the combined voltages V3+V4 equal to the magnitude of the input voltage V1 or to a desired value, such as 120v. To use the values of these voltages suggested previously, if the voltage V3 is 90 volts the number of turns in the winding 33 can be selected so that the voltage V4 will be 30v., producing an output voltage of 120 v. between the terminals 25 and 26.

It is also possible to make the number of turns in the winding 33 substantially larger than the number of turns in the first coil 13 in order to make the autotransformer a step-up transformer, such as from 110v. to 220v., although those voltages are only exemplary and the invention is not limited to a 1:2 ratio nor to those specific voltages. Since the winding 33 carries the same current as the winding 20, it must have a gauge that will safely do so.

Figure 5:
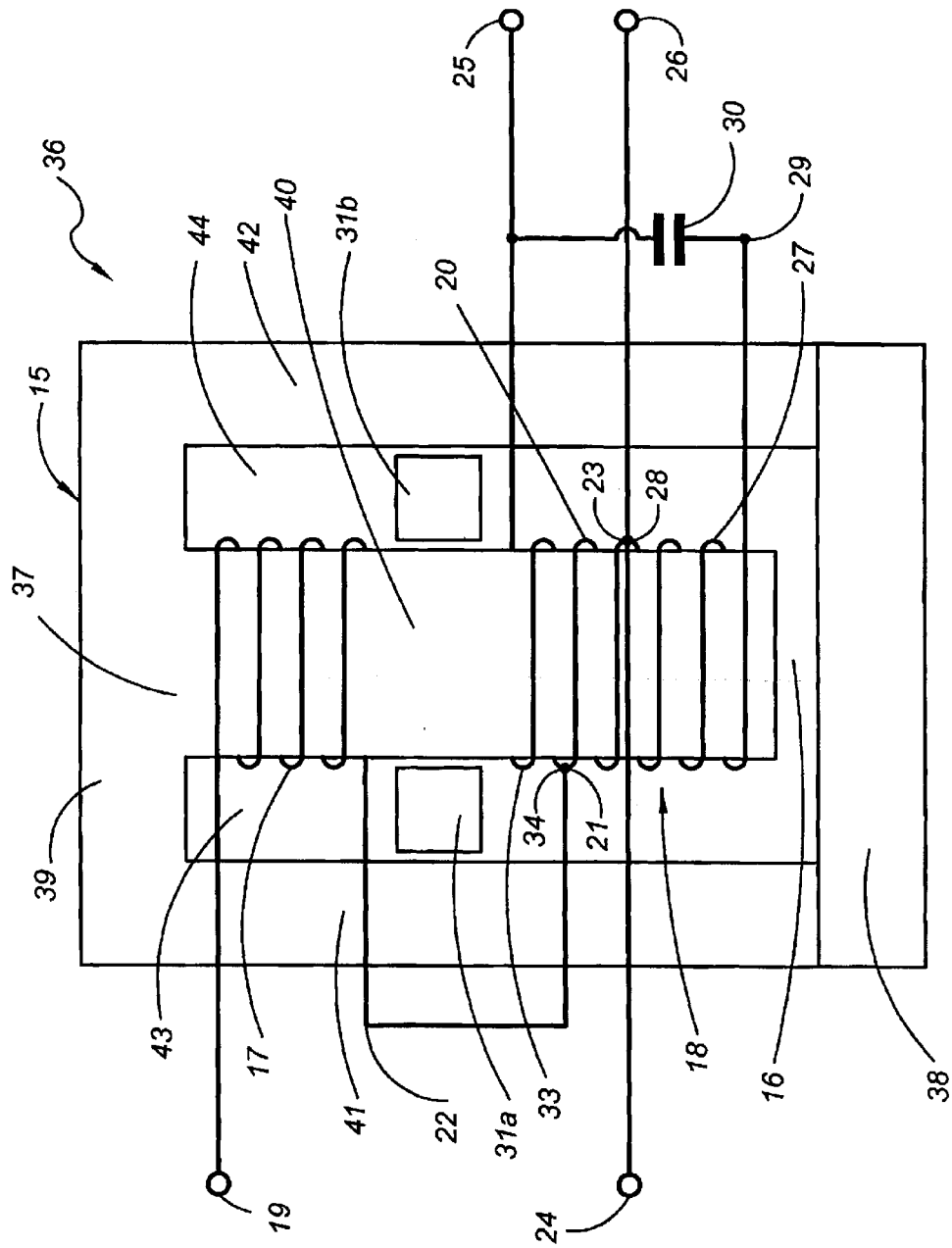
FIG. 5 shows one embodiment of a transformer and windings on it connected to produce the filtering effect of this invention.

FIG. 5 illustrates one example of a filter 36 that incorporates the main physical components of the filtering circuit 32 in FIG. 3. The reference numerals in this figure that are the same as reference numerals in FIG. 1 for corresponding components. In this embodiment, the core 14 is a stack of E laminations 37 and I laminations 38. The E laminations include a bar 39 that is part of a low-reluctance flux path that also includes a central winding leg 40, which corresponds to the winding leg 14 in FIG. 1, and two side return legs 41 and 42, which are adjacent the leg 40 and are included in the return means 15 in FIG. 1. The bar 39, the adjacent legs extending from it, and the I laminations, which may be considered a second bar, define windows 43 and 44. The coil 17 is located on the upper part of the winding leg 40 adjacent the bar 39, and the coil 18, comprising the windings 20, 27, and 33, is located below the coil 17 and spaced from it. The magnetic shunt means comprise two stacks of laminations 31a and 31b of transformer material in the windows 43 and 44, respectively, in the spaces between the coils 17 and 18. The shunt means bridge or almost bridge the distances between the winding leg 40 and the return legs 41 and 42 with a short air gap between each end of each stack 31a and 31b and the adjacent return leg.

In this embodiment of the invention, the return legs 41 and 42 meet the I laminations 38, but the winding leg 40 is shorter than the return legs, creating the air gap 16 at the bottom of the winding leg adjacent the coil 18. It is this air gap that creates an effective inductance in the windings 20, 27, and 33 of the coil 18.

The operation of the circuit of the filter 36 in FIG. 5 has already been explained in connection with FIGS. 3 and 4. While this filter satisfactorily performs its job in removing harmonics of the fundamental power-line frequency, it has the disadvantage of producing audible noise. The current in a power line is normally quite high, which causes the magnetic field produced in the magnetic circuit comprising the winding leg 40 and the return legs 41 and 42 to be quite strong. This causes a strong, oscillating attraction between the lower end of the winding leg and the I laminations 38 directly below it, and so the I laminations vibrate at the fundamental frequency of the alternating current. Even clamping the components of the core 13 firmly does not prevent the generation of a buzzing sound, although it can reduce the amplitude of that sound.

| Typical settings for a filter constructed according to the filter 32: | |
| --- | --- |
| Input voltage: | 120 v., 60 Hz, including 24% THD with a very low power factor of 0.64%. |
| Output voltage: | 120 v. with only 3.4% THD. |
| Lamination core with air gap: | 2" stack of M6, 29-gauge lamination with 0.1" air gap 16 in the center leg. |
| Shunt assembly 31a and 31b, each: | 0.6" stack of M6, 29-guage lamination with total shunt air gap of 0.015". |
| First coil 17: | 37 turns |
| Second coil 18: | 78 turns for winding 20, 340 turns for winding 27, and 32 turns for winding 33 |
| Capacitor 30: | 38 mfd. |
| Tests for filter 32 in FIG. 5: | |
| Input | 120 V., 9.9 A. 60 Hz, 24% THD, 0.64 PF |
| Output | 120 V., 6.0 A. 60 Hz, 3.4% THD, 0.99 PF |

If the distorted alternating current having 24% THD with a very low 0.64% power factor. As a result, the other 36% of the power is actually wasted in the power line, if this distorted alternating current is directly supplied to a user. By using the filter of this invention, dthe THD is reduced to only 3.4% with a power factor of 0.99%.

Figure 6:
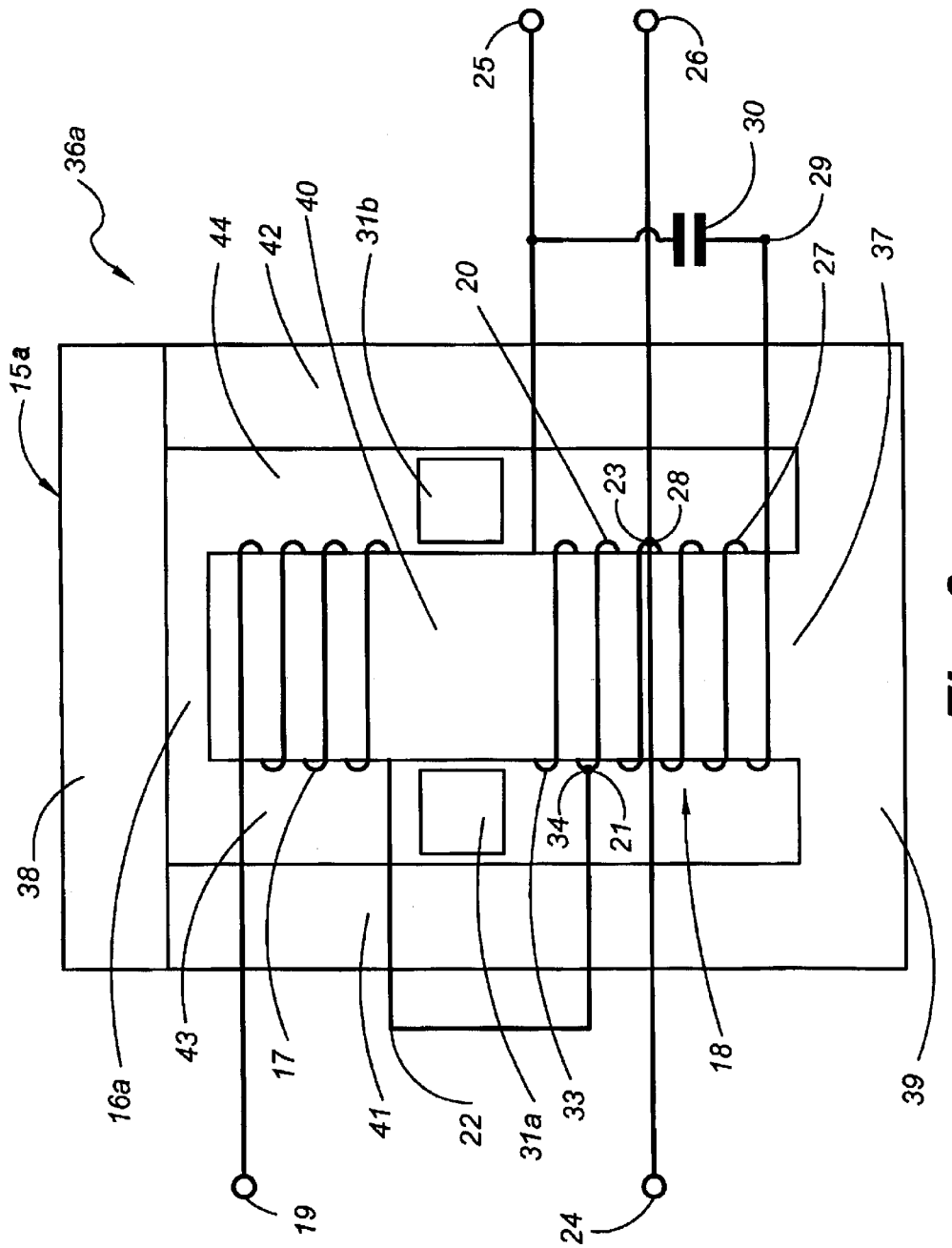
FIG. 6 is a transformer similar to the transformer in FIG. 5 but with the air gap in a different location.

FIG. 6 shows a filter 36a similar to the filter 36 in FIG. 5 but with the air gap 16a above the coil 17 rather than below the coil 18. That is, the coil 17 is between the air gap 16a and the coil 18. This places the air gap adjacent the smaller portion, i.e, the coil 17, of the combination of the coil 17 and the winding 20 that form the input circuit, which makes the input current a little less than in the filter 36 in FIG. 5 in which the air gap 16 is on the bottom end of the leg 40. This, in turn, allows the autotransformer 15a to be a little smaller than the autotransformer 15 in FIG. 5.

The arrangement of the components in FIG. 6 results in a little less harmonic attenuation than in FIG. 5, but that is acceptable if the filter is to isolate the harmonics generated from the output side, i.e,. beyond the output terminals 25 and 26, such as in the case of SCR and IGBT controllers (not shown) that generate harmonics feeding back to the power line.

Figure 7:
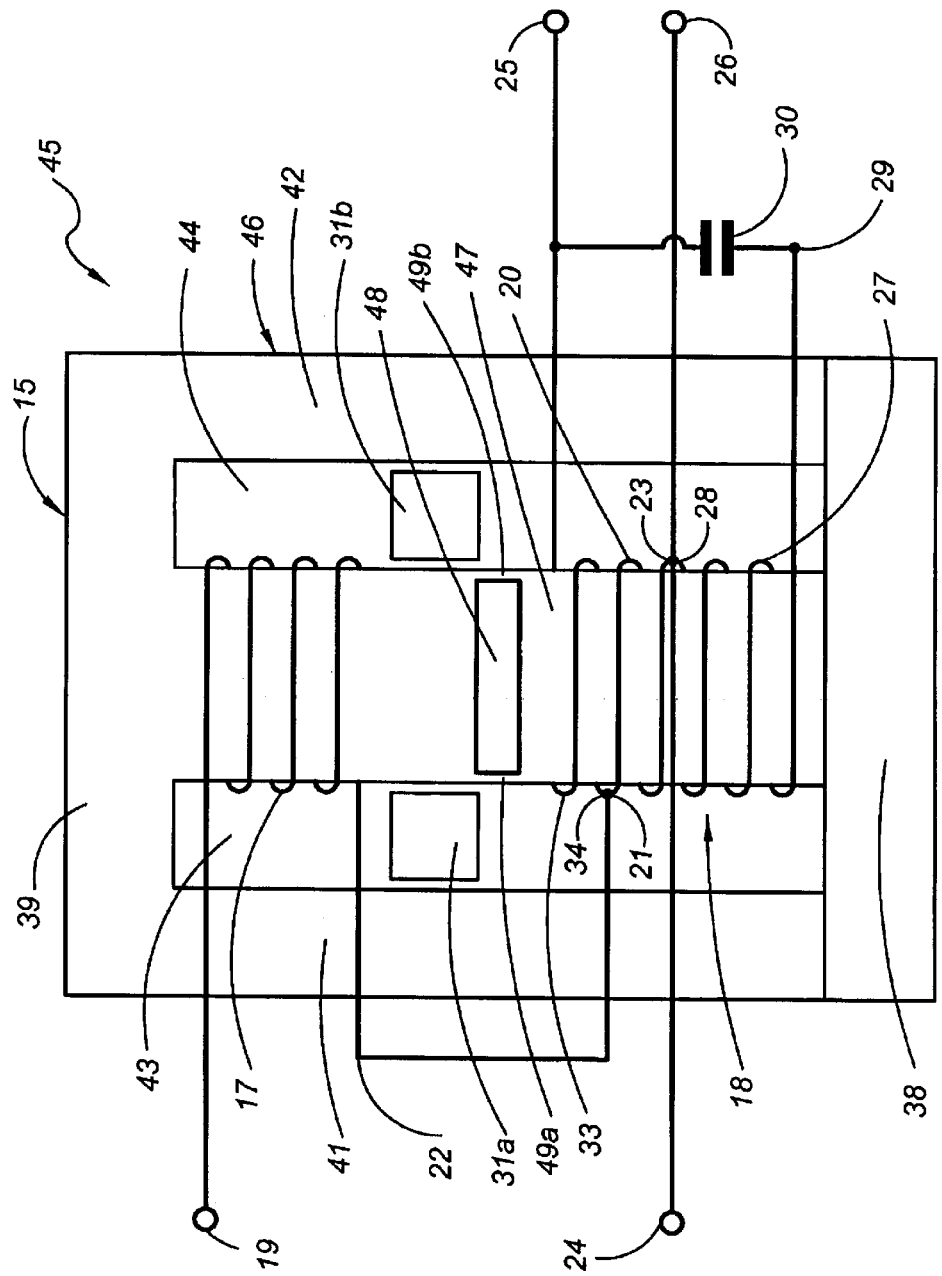
FIG. 7 is a modified form of a transformer with the air gap centrally located on the leg between the windings.

FIG. 7 shows another filter 45 that incorporates the circuit of the filter 32 in FIG. 3 and is, therefore, similar in operation. The difference between the filter 36 in FIG. 5 and the filter 45 is that the E laminations 46 of the latter have a central winding leg 47 that is as long as the return legs 41 and 42 so that the winding leg 47 extends the full distance from the bar 39 to the I laminations 38. Instead of an air gap at the lower end of the winding leg 47, a partial air gap 48 is located at the center of each E lamination 46 so that some of the E laminations, for example alternate ones, can be placed in opposite orientation from others, and each of these air gaps is bridged at each end by a narrow strip 49a and 49b of the lamination material. This strengthens the E laminations and prevents the audible buzzing that takes place in the filter 36. Because the air gaps 48 are less than complete, due to the narrow strips of lamination material 49a and 49b, they could be referred to as partial air gaps or as regions of increased reluctance, although it is easier to refer to them simply as air gaps. By placing the air gaps 48 in the longitudinal center of the central winding leg 47, the orientation of each E lamination 46 and the I lamination 38 coplanar with it can be aligned as illustrated in FIG. 6 or in the opposite position, with that I lamination at the top. The air gaps of all E laminations will still be aligned with each other and the noise created by the magnetic fields will be minimized or eliminated. This permits alternate E-I laminations sets to be oriented in the reverse direction, because the air gaps 48 will be in the center in either case.

Figure 8:
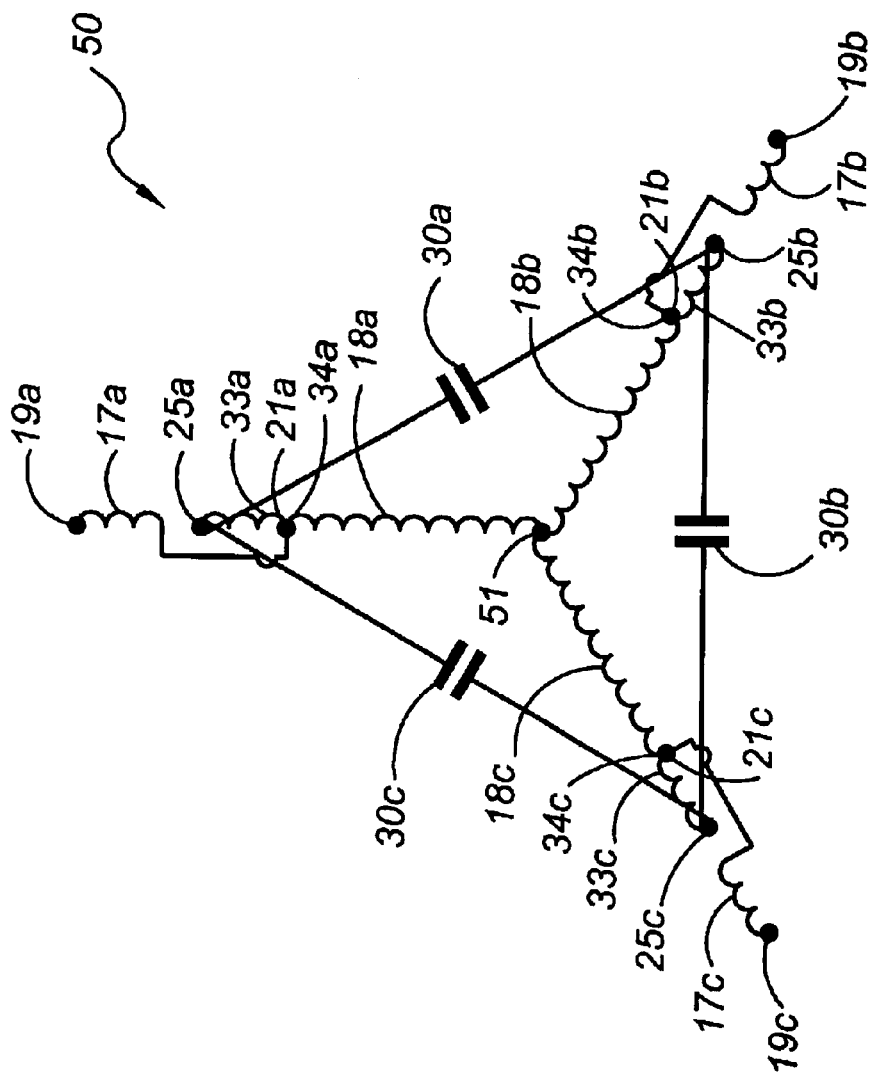
FIG. 8 is a schematic diagram of a three-phase filtering circuit according to this invention.

FIG. 8 is a schematic diagram of a filter 50 to be used on a three-phase power line. The reference numerals used in this diagram are similar to those used in FIGS. 1–4 to the extent possible to simplify the explanation of operation. Since most of the components are in threes, they are made distinct by using a, b, and c suffixes.

The filter 50 has three input terminals 19a–19c to be connected to the three wires of a three-phase power line. These terminals are at the operative ends of three coils 17a–17c, although there may be a plurality of additional terminals on each coil to accommodate different input voltages or line conditions. As in the filter 32 in FIG. 3, each of these coils has a second terminal connected to one terminal 21a–21c of a respective coil 18a–18c to form three series input circuits to receive potentially distorted alternating current from a three-phase power line. In this three-phase filter, the coils 18a–18c are connected to a common terminal 51, making this a wye-connected input circuit.

The output terminals 25a–25c of the filter 50 are connected to terminals 34a–34c, respectively, to derive a three-phase, filtered alternating current in a manner similar to that described previously for single-phase filters. As in the single-phase filters, if the output terminals were connected directly to the terminals 34a–34c, the output voltages would be somewhat less than the input voltages. In order to increase the output voltages, for example, to bring them up to the value of the input voltages, windings 33a–33c are connected in series between the terminals 34a–34c and the output terminals 25a–25c, respectively. These windings, which may be considered parts of the coils 18a–18c, respectively, operate in a manner similar to that of the winding 33 in FIG. 3.

The three-phase filter 50 has three capacitors 30a–30c connected to resonate with inductors produced in the coils 18a–18c by air gaps in the core in the same way that an inductor is produced in the filter 32 in FIG. 3, for example. As in that filter, the resonant circuit substantially reduces harmonics in the output alternating current at the terminals 25a–25c.

In the three-phase circuit in FIG. 8, the capacitors are connected in a delta configuration and so the voltage across each of them is √3×V3. Since three-phase circuits normally have a voltage V1 of 440v. it is not necessary to include a winding equivalent to the winding 27 in FIG. 3 to provide a high voltage across each of the capacitors 30a–30c. In addition, capacitors of the type normally used in connection with power lines normally are rated to handle a maximum voltage of about 450V.

Figure 9:
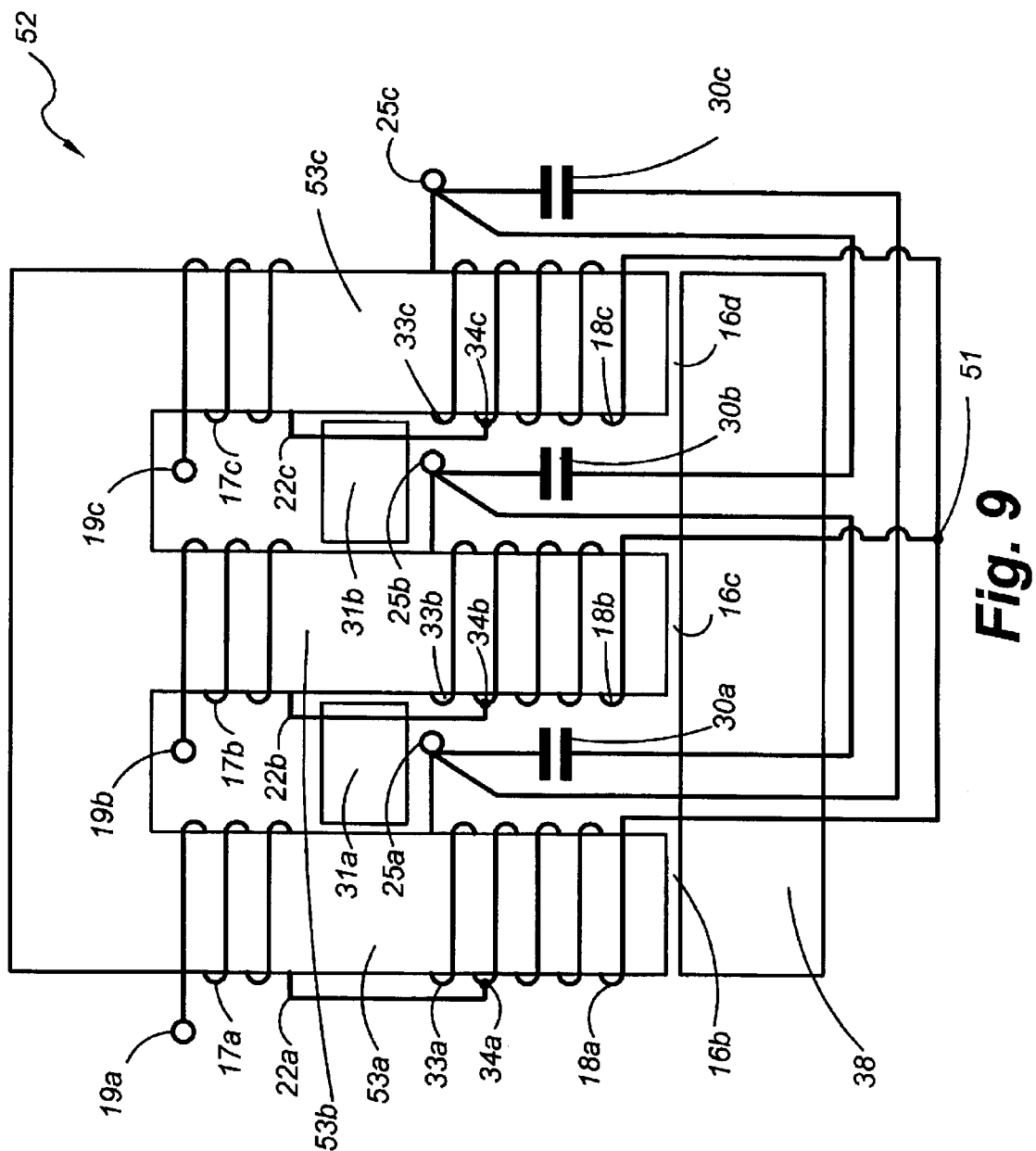
FIG. 9 is an example of three-phase filtering system according to this invention.

FIG. 9 shows a configuration of a three-phase filter 52 similar to the single-phase filter 36 in FIG. 5 in which the coil 18 is between the coil 17 and the air gap 16. Because of the fact that the filter 52 is arranged for three-phase operation, and each of the legs 53a–53c serves as both a winding leg and a return leg, there is an air gap 16b–16d between the lower end of each of the legs 53a–53c and the stack of I laminations 38. This places the coils 18a–18c between the coils 17a–17c and the air gaps 16a–16c.

Figure 10:
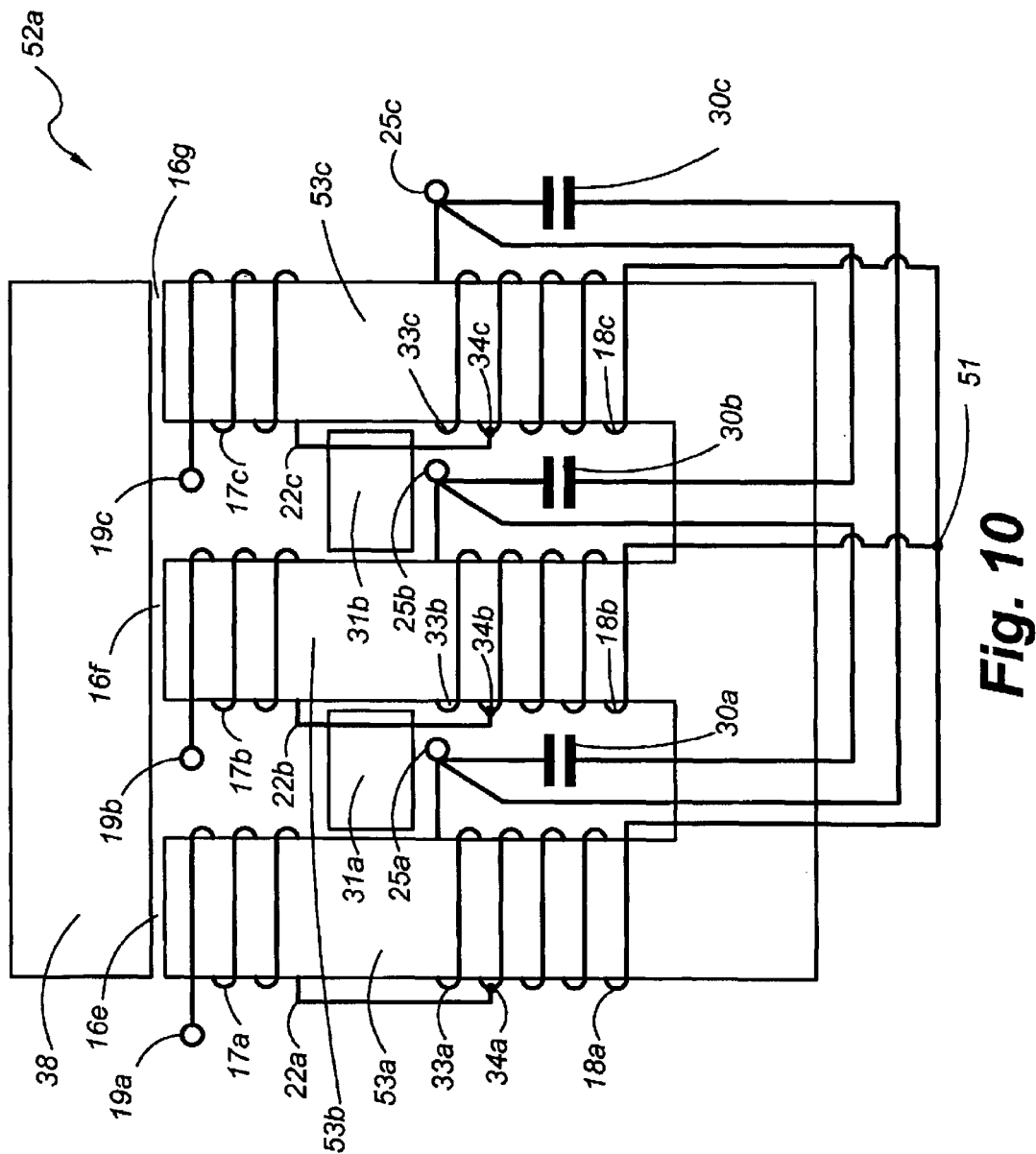
FIG. 10 shows a three phase transformer similar to that in FIG. 9 but with the first coil on each leg between the air gaps and the windings on that leg.

FIG. 10 shows a filter for a three phase power system similar to the filter in FIG. 9 except that the transformer 52a has air gaps 16e–16g between the coils 17a–17c and the upper bar 38 so that the coils 17a–17c are between the air gaps and the coils 18a–18c. As in the transformer 36a in FIG. 6, this location of the air gaps allows the input current to be somewhat less than in the filter 52 in FIG. 9.

Figure 11:
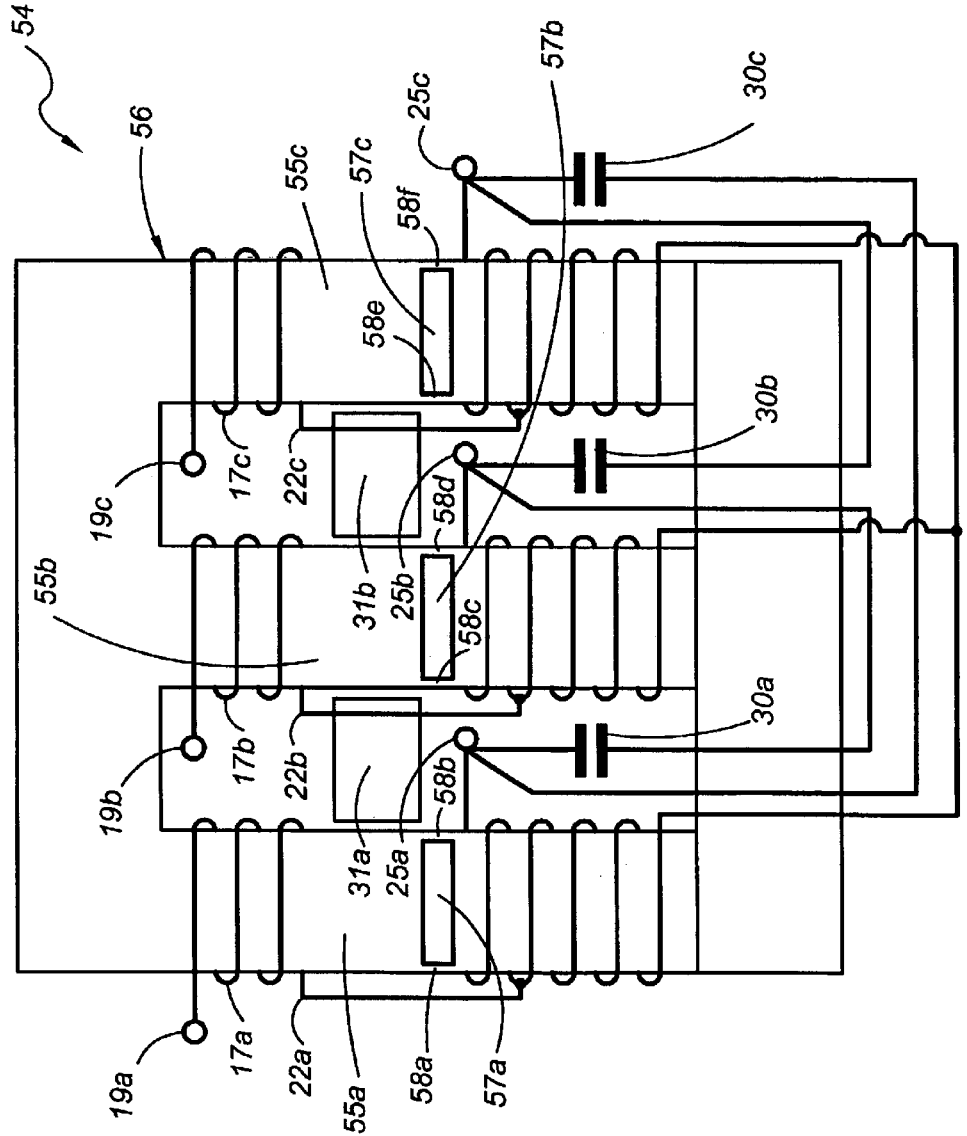
FIG. 11 shows a modified transformer in a three-phase filtering system having an air gap between the coils on each leg according to this invention.

FIG. 11 shows yet another configuration of a three-phase filter 54 similar to the single-phase filter 45 in FIG. 7, which has a partial air gap 48 only in the central leg 47. In FIG. 11, each of the three legs 55a–55c in the core 56 of the filter serves as both a winding leg and a return leg, and each leg has a partial air gap 57a–57c bridged at each end by a narrow support 58a–58f to minimize or eliminate audible vibration in response to the alternating current applied to the filter.

What is claimed is:

1. A filter to remove harmonics comprising:
   (a) an autotransformer with a ferromagnetic core having a plurality of legs forming a low-reluctance flux path, a first bar forming the low-reluctance flux path between the legs at one end of the core, and a second bar forming a low-reluctance flux path between the legs at the other end of the core;
   (b) first and second coils, having first and second terminals, the first and second coils being spaced apart at a first location on one of the legs;
   (c) an electrical connection between the second terminal of the first coil and the first terminal of the second coil, "whereby the first and second coils are in a series input circuit to receive the alternating current to be filtered, said current generating flux in the first leg";
   (d) a filter output terminal;
   (e) means to connect the electrical connection to the output terminal;
   (f) a region of increased reluctance in a part of the flux path linking the second coil, thereby forming a built-in inductor in the second coil;
   (g) magnetic shunt means which magnetically couples one of the legs at a third location between the first and second locations to an adjacent one of the legs where some of the flux generated by alternating current flowing in the first coil is by-passed through the shunt means to the adjacent leg without linking with the second coil; and
   (h) capacitor means connected across the second coil to resonate with the built-in inductor at the fundamental frequency.

2. The filter of claim 1 in which the region of increased reluctance is an air gap.

3. The filter of claim 2 in which the air gap is at an end of the one leg between the second coil and the second bar.

4. The filter of claim 2 in which the air gap is at an end of the one leg between the first bar and the first coil.

5. The filter of claim 2 in which the region of increased reluctance is a partial air gap located between the first and second coils and bounded by narrow bridges.

6. The filter of claim 5 in which the air gap is between the third location and the second coil and midway between the first and second bars.

7. The filter of claim 1 in which there are three of the legs in a row, and the one leg is centrally located between the other two legs and is shorter than the other two legs.

8. The filter of claim 1 in which:
   (a) the first bar and the legs are components of a stack of E laminations in which one end of each of the legs is joined to the first bar and the legs include a central leg and first and second side legs;
   (b) the second bar comprises a stack of ferromagnetic I laminations;
   (c) the coils are wound on the central leg; and
   (d) the return means comprise the first and second side legs, the side legs being spaced apart from the central leg, whereby the central leg and one of the side legs and portions of the bars joining those two legs form a first window, and the central leg and the other side leg and portions of the bars joining the central leg and the other side leg form a second window between them.

9. The filter of claim 8 in which the magnetic shunt means extend all the way across the first and second windows, respectively.

10. The filter of claim 1 in which the second coil comprises first and second windings connected in series with each other as a second series circuit in which the first winding is between the first coil and the second winding.

11. The filter of claim 1 in which the second coil comprises a third winding which comprises the means to connect the electrical connection to the output terminal.

12. The filter of claim 11 in which:
   (a) the first winding in the second coil is connected in series between the electrical connection and the second winding, whereby the first, second and third windings form an entire second coil; and
   (b) the capacitor is connected across the entire second coil.

13. The filter of claim 1 in which the alternating current is a three-phase current and:
   (a) the autotransformer has three legs forming parts of a low-reluctance flux path;
   (b) a first coil and a second coil on each of the legs, each of the first coils being at a first location on a respective one of the legs and comprising respective first and second terminals thereon and each of the second coils comprising respective first and second terminals thereon and being at a second location spaced from the first location on the same leg as the respective first coil;
   (c) second and third electrical connections, each of the electrical connections joining the second terminal of a respective one of the first coils to the respective first terminal of the second coil on the same leg, whereby the first and second coils on each leg are in a respective one of three series input circuits to receive one phase of the three-phase alternating current to be filtered, each phase of said current generating flux in each of the legs;
   (d) second and third filter output terminals;
   (e) second and third means to connect each of the second and third electrical connections to the respective one of the second and third output terminals, whereby there is a separate one of the three means to connect each of the three electrical connections to a respective one of the three output terminals;
   (f) a plurality of regions of increased reluctance, each in a part of the flux path linking the respective second coil on a respective one of the legs, whereby flux in that part of each leg creates a built-in inductor in the second coil on that leg;
   (g) magnetic shunt means magnetically coupling said one of the legs at a third location thereon between the first and second locations to an adjacent one of the legs, whereby some of the flux generated by alternating current flowing in the first coil on each of the legs is by-passed through the shunt means to the adjacent leg without linking with the second coil on the same leg; and (h) three capacitors, each connected across a respective one of the second coils to resonate with the built-in inductor at the fundamental frequency.

14. The filter of claim 13 in which each of the second coils on the respective second and third legs comprises a respective second winding on the same leg connected in series between the electrical connection between the first and second coils on the same leg and the respective second and third output terminals.

15. The filter of claim 14 in which each of the three capacitors is connected in series between a respective pair of the output terminals, whereby the capacitors are delta-connected.

16. The filter of claim 13 in which:

(a) each of the second coils comprises a respective second terminal remote from the electrical connection between the first and second coils on the same leg; and (b) all three of the remote terminals are connected together, whereby the three second coils are wye-connected.

17. A filter to remove harmonics from distorted, three-phase alternating current applied to the filter, the filter comprising:

(a) an autotransformer comprising a core of ferromagnetic material, the core including:
  (i) a first set of laminations with three parallel legs comprising a central leg and first and second side legs on opposite sides of the central leg, and a first bar portion magnetically joined to one end of each of the legs, and
  (ii) a second set of laminations comprising a bar portion magnetically linked to the other end of each of the legs, whereby each of the legs forms a winding leg for one phase of the current and, together with the bar portions, generally low-reluctance flux circuit means;

(b) a plurality of first coils, each at a corresponding first location on a respective one of the legs, each of the first coils having respective first and second terminals;

(c) a plurality of second coils, each at a corresponding second location on a respective one of the legs, the second location on each of the legs being spaced from the first location on that leg, each of the second coils comprising respective first and second terminals, the second terminal of the first coil on each leg being connected to the first terminal of the second coil on the same leg, whereby each pair of first and second coils on a respective leg forms part of a respective series input circuit to receive one phase of the three-phase alternating current, the second terminal of each of the second coils being connected together, whereby the second coils are wye-connected;

(d) a region of increased reluctance in a corresponding part of each of the legs linked to the respective second coil on that leg to create a respective built-in inductor in each of the second coils;

(e) first and second magnetic shunt assemblies, one end of the first shunt assembly extending from a location between the first and second coils on the first side leg to a location between the first and second coils on the center leg, and the second shunt assembly extending from a location between the first and second coils on the center leg to a location between the first and second coils on the second side leg to a location between the first and second coils on the center leg whereby some of the flux generated in each of the first coils by the respective phase current flowing in that first coil is by-passed through the shunt assemblies to the side legs without passing through the respective second coil on the same leg;

(f) three capacitors, each connected in parallel with a respective one of the second coils to resonate with the built-in inductor of that coil at the fundamental frequency; and (g) three output terminals, the respective first terminal of each of the second coils being connected to a respective one of the output terminals.

18. The filter of claim 17 in which there is an air gap between the first bar and the ends of all of the legs closer to the respective second coil.

19. The filter of claim 17 in which there is an air gap between the second bar and the ends of all of the legs closer to the respective first coil.

20. The filter of claim 17 in which there is an air gap centrally located in each of the legs between the ends thereof, and each of the air gaps is bridged by a narrow strip of lamination material, one end of each leg being in contact with the first bar, and the other end of each leg being in contact with the second bar.

21. A filter to remove harmonics comprising:

(a) an autotransformer with a ferromagnetic core having a plurality of legs forming a low-reluctance flux path, a first bar forming the low-reluctance flux path between the legs at one end of the core, and a second bar forming a low-reluctance flux path between the legs at the other end of the core;

(b) first and second coils, having first and second terminals, the first and second coils being spaced apart at a first location on one of the legs;

(c) an electrical connection between the second terminal of the first coil and the first terminal of the second coil, whereby the first and second coils are in a series input circuit to receive the alternating current to be filtered, said current generating flux in the first leg;

(d) a filter output terminal;

(e) means to connect the electrical connection to the output terminal;

(f) a region of increased reluctance in a part of the flux path linking the second coil, thereby forming a built-in inductor in the second coil;

(g) magnetic shunt means which magnetically couples one of the legs at a third location between the first and second locations to an adjacent one of the legs, where some of the flux generated by alternating current flowing in the first coil is by-passed through the shunt means to the adjacent leg without linking with the second coil; and (h) capacitor means connected across the second coil to resonate with the built-in inductor at the fundamental frequency.

* * * * *